United States Patent
Wolf et al.

(10) Patent No.: US 11,329,436 B2
(45) Date of Patent: May 10, 2022

(54) ELECTRICAL CONTACT ELEMENT FOR A PLUG CONNECTOR, PLUG CONNECTOR AND METHOD FOR MONITORING AN ELECTRICAL CURRENT FLOW

(71) Applicant: TE Connectivity Germany GmbH, Bensheim (DE)

(72) Inventors: Marco Wolf, Hochstadt (DE); Michael Ludwig, Mannheim (DE); Martin Rieder, Schifferstadt (DE)

(73) Assignee: TE CONNECTIVITY GERMANY GMBH, Bensheim (DE)

( * ) Notice: Subject to any disclaimer, the term of this patent is extended or adjusted under 35 U.S.C. 154(b) by 0 days.

(21) Appl. No.: 16/925,875

(22) Filed: Jul. 10, 2020

(65) Prior Publication Data
US 2020/0343675 A1  Oct. 29, 2020

Related U.S. Application Data

(63) Continuation of application No. PCT/EP2019/050824, filed on Jan. 14, 2019.

(30) Foreign Application Priority Data

Jan. 18, 2018 (DE) .......................... 102018200886.8

(51) Int. Cl.
*H01R 13/66* (2006.01)
*B60L 53/16* (2019.01)
(Continued)

(52) U.S. Cl.
CPC .......... *H01R 13/6683* (2013.01); *B60L 53/16* (2019.02); *G01K 1/026* (2013.01);
(Continued)

(58) Field of Classification Search
CPC ............ H01R 13/6683; H01R 2201/20; H01R 2201/26; H01R 13/66; B60L 53/16;
(Continued)

(56) References Cited

U.S. PATENT DOCUMENTS

| 2005/0209813 A1* | 9/2005 | Kautz .................... G01K 7/427 374/E7.042 |
| 2012/0119702 A1* | 5/2012 | Gaul .................... H01R 13/665 439/620.21 |

(Continued)

FOREIGN PATENT DOCUMENTS

| CN | 107454877 A | 12/2017 |
| DE | 10332325 A1 | 2/2005 |

(Continued)

OTHER PUBLICATIONS

Christopher R. Shaddix, A new method to compute the proper radiant heat transfer correction of bare-wire thermocouple measurements, Apr. 23-26, 2017, 10th U. S. National Combustion Meeting Organized by the Eastern States Section of the Combustion Institute, SAND2017-4406C (Year: 2017).*

(Continued)

*Primary Examiner* — Kevin J Comber
*Assistant Examiner* — Sreeya Sreevatsa

(57) ABSTRACT

An electrical contact element for a plug connector includes an electrically conductive base body electrically connected to a mating contact element, the base body having a longitudinal axis extending along a plugging direction between the contact element and the mating contact element, and a first temperature probe and a second temperature probe (Continued)

arranged at a pair of different measurement regions of the contact element spaced apart from each other along the longitudinal axis.

12 Claims, 3 Drawing Sheets

(51) Int. Cl.
*G01K 1/02* (2021.01)
*G01K 3/00* (2006.01)
*G01K 3/08* (2006.01)
*G01K 7/02* (2021.01)
*H02H 5/04* (2006.01)
*H02J 7/00* (2006.01)

(52) U.S. Cl.
CPC ............... *G01K 3/005* (2013.01); *G01K 3/08* (2013.01); *G01K 7/02* (2013.01); *H02H 5/042* (2013.01); *H02J 7/0045* (2013.01); *B60L 2250/10* (2013.01); *H01R 2201/20* (2013.01); *H01R 2201/26* (2013.01)

(58) Field of Classification Search
CPC .... B60L 2250/10; G01K 1/026; G01K 3/005; G01K 3/08; G01K 7/02; H02H 5/042; H02J 7/0045

USPC .......................................................... 361/78
See application file for complete search history.

(56) References Cited

U.S. PATENT DOCUMENTS

| | | | |
|---|---|---|---|
| 2015/0064526 A1* | 3/2015 | Ramsayer | H01M 10/486 429/90 |
| 2016/0081629 A1* | 3/2016 | Rostalski | G01K 7/427 600/549 |
| 2018/0050599 A1* | 2/2018 | Sauer | B60L 53/305 |

FOREIGN PATENT DOCUMENTS

| | | |
|---|---|---|
| DE | 102006016956 A1 | 10/2007 |
| DE | 102014213757 A1 | 1/2016 |
| DE | 102015206840 A1 | 10/2016 |
| DE | 102016107401 A1 | 8/2017 |
| EP | 3246782 A1 * | 11/2017 ......... G05D 23/1931 |

OTHER PUBLICATIONS

I.Narita, Car adapter with thermal sensors, IBM technical disclosure bulletin, vol. 38 No. 04 Apr. 1995 (Year: 1995).*
PCT Written Opinion of the International Searching Authority and the International Search Report, dated Apr. 12, 2019, 11 pages.

* cited by examiner

ELECTRICAL CONTACT ELEMENT FOR A PLUG CONNECTOR, PLUG CONNECTOR AND METHOD FOR MONITORING AN ELECTRICAL CURRENT FLOW

CROSS-REFERENCE TO RELATED APPLICATIONS

This application is a continuation of PCT International Application No. PCT/EP2019/050824, filed on Jan. 14, 2019, which claims priority under 35 U.S.C. § 119 to German Patent Application No. 102018200886.8, filed on Jan. 18, 2018.

FIELD OF THE INVENTION

The present invention relates to an electrical contact element for a plug connector and, more particularly, to monitoring a temperature at the plug connector during an electrical current flow.

BACKGROUND

Electric vehicles can be charged in various charging modes. At present, modes 1 to 5 are defined. These vary, inter alia, in relation to safety devices, communication with the vehicle, and charging performance. Essentially a distinction is made between charging by means of alternating current (modes 1 to 3), which can also take place via a common household power supply, but takes a relatively long time, and substantially more rapid direct-current charging (mode 4 and mode 5).

At present, so-called CCS plugs ("Combined Charging System") exist, for example, which enable both charging types and support a power of 350 kW. Electric vehicle batteries can thus be charged to 80 percent within a few minutes at appropriate charging stations by means of direct current. For comparison: At a plug socket in one's own garage, the charging of a conventional electric vehicle battery takes seven to eight hours. Future direct current charging plugs must safely transmit even higher power levels of, for example, up to 500 kW.

In order to make sure that the contact elements of the plug apparatus do not overheat, the temperatures of the connector, cable, and the other power components must be monitored in all rapid DC charging systems. For operation with currents above 200 A, coupler and plug must be equipped with independent means for a permanent monitoring of temperature in all DC contacts. If one of the DC contacts reaches a temperature of 90° C. or higher, at least one sensor at the plug and at the coupler must forward this to an evaluation unit within 30 seconds. In the case of a plug connector, the contact zone represents the hottest and thus the region most at risk. However, there is no practicable possibility of detecting the temperature directly in the contact zone.

By way of example, it is known from DE 10 2016 107401 A1 to provide an electrically conductive contact element with a contact region for producing a contact to a complementary contact element and with a connection region for the connection of an electrical line and at least one temperature sensor, which detects the temperature in a measurement region of the contact element, which lies between the aforementioned connection region and the contact region.

It can be shown, however, that the heat which arises in the contact region is transmitted so slowly in the direction of the measurement region that the temperature detected in the measurement region does not reach critical values until the contact region has already overheated to dangerous levels. A separation of 20 mm between the temperature sensor and the contact region is already too large to still satisfy the requirements of the corresponding safety regulations.

The temperature in the contact region thus would have to be extrapolated from the temperature in the measurement region. However, in order to derive a reliable model for calculating an estimated value for the temperature in the contact region from the temperature in the measurement region, and thus to predict at which measured temperatures a reduction in, and/or interruption of, the power transmission must be undertaken, too many heat equations must be solved. In particular, a temperature sensor arrangement which is located in a single measurement region along the longitudinal axis of the contact element, cannot differentiate between the effects which come from the contact region, and consequently the heat source, and the effects which come from the connection region, i.e. the heat sink. The influences of the cable on the connection region can vary dramatically in the application environment, such that a prediction is plagued by dangerous uncertainties.

There is therefore a need for safe and precise monitoring of the temperature in a contact region of a plug connector, enhancing and simplifying the monitoring of an electrical current flow in particular when charging the battery of an electric vehicle.

SUMMARY

An electrical contact element for a plug connector includes an electrically conductive base body electrically connected to a mating contact element, the base body having a longitudinal axis extending along a plugging direction between the contact element and the mating contact element, and a first temperature probe and a second temperature probe arranged at a pair of different measurement regions of the contact element spaced apart from each other along the longitudinal axis.

BRIEF DESCRIPTION OF THE DRAWINGS

The invention will now be described by way of example with reference to the accompanying Figures, of which.

DETAILED DESCRIPTION OF THE EMBODIMENT(S)

To better understand the present invention, it is explained in greater detail using the exemplary embodiments depicted in the figures. Identical parts here are provided with identical reference numbers and identical component names. Furthermore, individual features or combinations of features from the shown and described embodiments taken separately may represent independent inventive solutions or solutions according to the invention.

Figure 1:
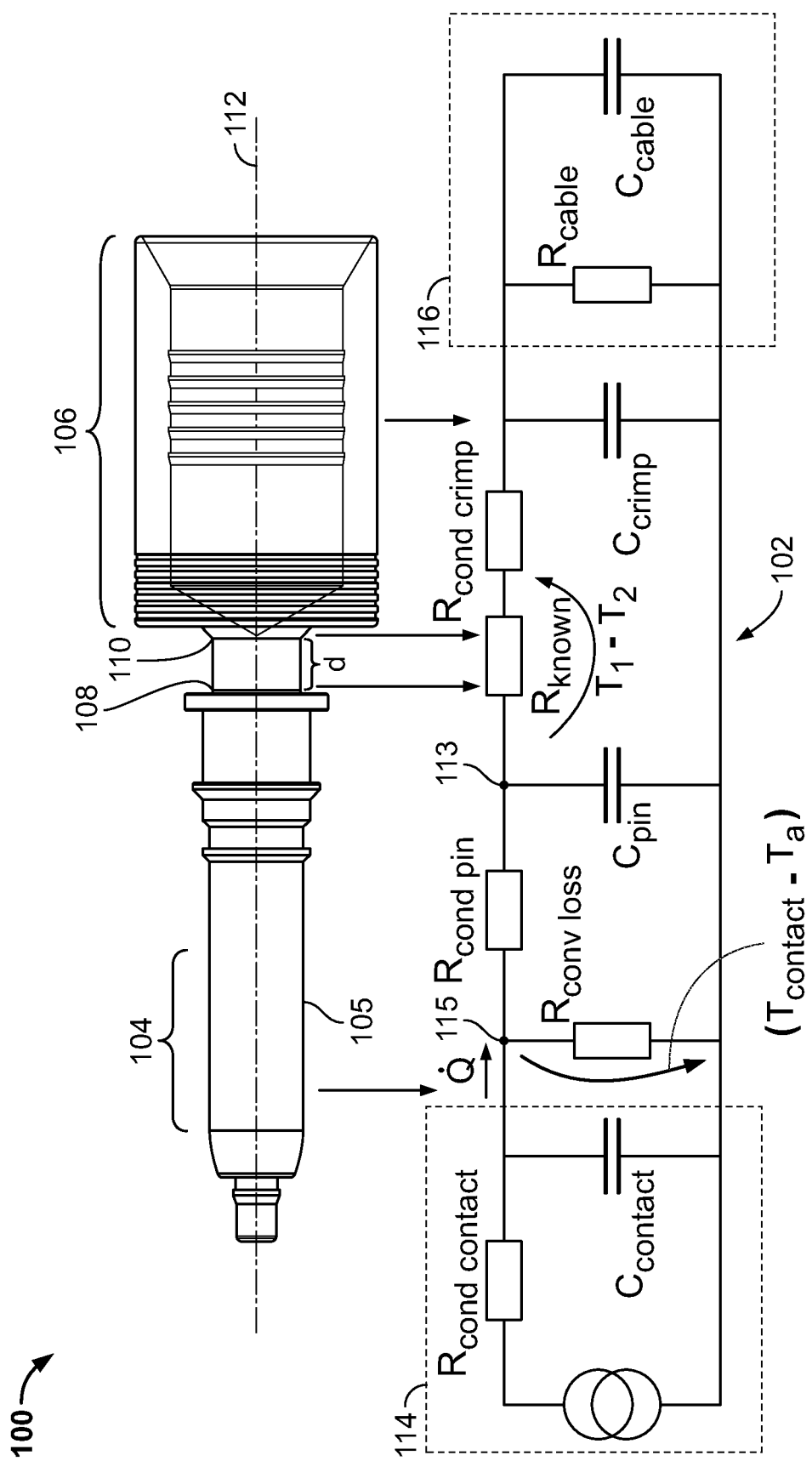
FIG. 1 is a schematic diagram of a contact pin according to an embodiment and a thermal equivalent circuit diagram of the contact pin.

A contact pin 100 according to an embodiment, as shown in FIG. 1, is used in a charging cable plug connector for charging the battery of an electric vehicle, and the thermal equivalent circuit diagram 102 of the contact pin 100. In other embodiments, the contact pin 100 can be any kind of contact element and may also be referred to as a contact element 100.

In order to transmit an electric current, the contact pin 100 (hereinbelow also referred to as a pin) is connected to a corresponding mating contact element, i.e. to a contact bushing (not shown in the figures). The electrical transition between the contact pin 100 and the contact bushing takes place in a contact region 104 of the contact pin 100.

The contact pin 100 has a base body 105 and a connection region 106, as shown in FIG. 1, which in the present case is formed as a crimp connection for the connection of a cable. The base body 105 is electrically conductive. According to the invention, the contact pin 100 has a first measurement region 108 and a second measurement region 110, which have a known spacing d from each other in respect of a longitudinal axis 112 of the base body 105. The longitudinal axis 112 runs along a plugging direction of the contact pin 100 into the associated bushing or mating contact element (not shown). A first temperature probe is placed in the first measurement region 108, and a second temperature probe is placed in the second measurement region 110 (the temperature probes are not shown in FIG. 1).

In an embodiment, the two measurement regions 108, 110 are placed in a region with the smallest cross-section of the contact pin 100. A particularly precise prediction of the temperature in the contact region 104 can be ensured if the two temperature probes are placed in such a way that the base body 105 has a smaller thermally conductive cross-sectional area in the two measurement regions 108, 110 than in the other regions of the contact pin 100. In this way, the sensor arrangement is able to detect the temperature gradient in the place where it is highest.

In another embodiment, the principles according to the invention can also be used when the contact pin 100 has a contact bushing. Furthermore, more than just one first and one second temperature probe can also be provided, which are arranged on the same or further offset measurement regions, in respect of the longitudinal axis 112.

FIG. 1, moreover, shows the thermal equivalent circuit diagram 102 of the contact pin 100. In the case of such a thermal equivalent circuit diagram 102, the heat flow $\dot{Q}$ corresponds to the electric current of an electrical circuit diagram, while a temperature difference should be equated to the electric voltage in an electrical circuit diagram. As can be seen in the thermal equivalent circuit diagram 102 shown in FIG. 1, the section between the two measurement regions 108, 110 has a thermal resistance $R_{known}$, which can be ascertained by appropriate calibration measurements. This known thermal resistance $R_{known}$ can therefore be used for the thermal modelling of the pin 100.

In the equivalent circuit diagram 102, the transition to the mating contact element forms a heat source 114 with the thermal resistance $R_{cond\ contact}$, which corresponds to the heat conduction through the mating contact element, and the heat capacity $C_{contact}$ of the mating contact element, while the thermal resistance $R_{cable}$ and the heat capacity $C_{cable}$ of the cable represent a heat sink 116. The thermal resistance $R_{cond\ pin}$, which corresponds to the heat conduction through the pin 100, and the heat capacity $C_{pin}$ of the pin 100 reflect the material properties and the design of the base body 105. In a corresponding manner, the thermal resistance $R_{cond\ crimp}$, which corresponds to the heat conduction through the crimp connection, and the heat capacity $C_{crimp}$ of the crimp connection reflect the material properties and geometry of the crimp connection. These material and design variables are identical for all contact pins in a series, and can be ascertained by suitable calibration methods and integrated into the model.

If the absolute temperature at a first node point 113 and a temperature difference T1-T2, which drops over the resistance $R_{known}$ as shown in FIG. 1, are known, the heat flow which flows through the resistance $R_{known}$ can be calculated. Assuming that the heat capacity $C_{pin}$ of the contact pin 100 is completely saturated, the heat flow through the resistance $R_{cond\ pin}$ is identical to the heat flow through $R_{known}$. This is the sought heat flow $\dot{Q}$ at a second node point 115, provided that the influence of the convection losses to the environment is disregarded.

The thermal resistance $R_{conv\ loss}$ symbolizes the convection losses to the environment. If the ambient temperature Ta is known, then this value also can be modelled. In this way, the value of the contact temperature can be predicted from the values of the absolute temperature at the first node point 113 and the temperature difference T1-T2.

The present invention is based on the idea of placing two temperature sensors at the contact pin 100 or contact element along the course of the heat flow. As a result, the thermal resistance between the two temperature sensors (also referred to as temperature probes hereinbelow) can be determined via a calibration step and thus the number of thermal unknowns can be reduced. If the thermal resistance between the two temperature sensors is known, the output signals of the two temperature sensors can be evaluated in their temporal profile (for example in discrete time steps) and the size and direction of the heat flow and the temporal change thereof can be calculated therefrom. The thermal resistances for the heat conductivity at the transition between the contact pin 100 or contact element and a corresponding mating contact element and for the connection zones (for example a crimp connection) are dependent on the design and can likewise be ascertained by calibration. It can be shown that, for a reliable prediction of the temperature in the contact region 104, moreover only the influence of the thermal convection losses to the environment is still important, but this can be taken into account for example via the ascertaining of the ambient temperature.

According to the invention, a first thermocouple which ascertains the first temperature value T1 is placed at the first measurement region 108. A second thermocouple which ascertains a second temperature value T2 is arranged at the second measurement region 110. The thermocouples are welded onto the base body 105, for example. In an embodiment, such thermocouples can be produced with a very low parameter variance, such that the measurement of the two values T1 and T2 can take place with largely matching accuracy. As a result of the fact that the two thermocouples are attached directly onto the base body 105 and have a low heat capacitance themselves, low thermal coupling can be ensured between the two measured temperature values T1 and T2.

Figure 2:
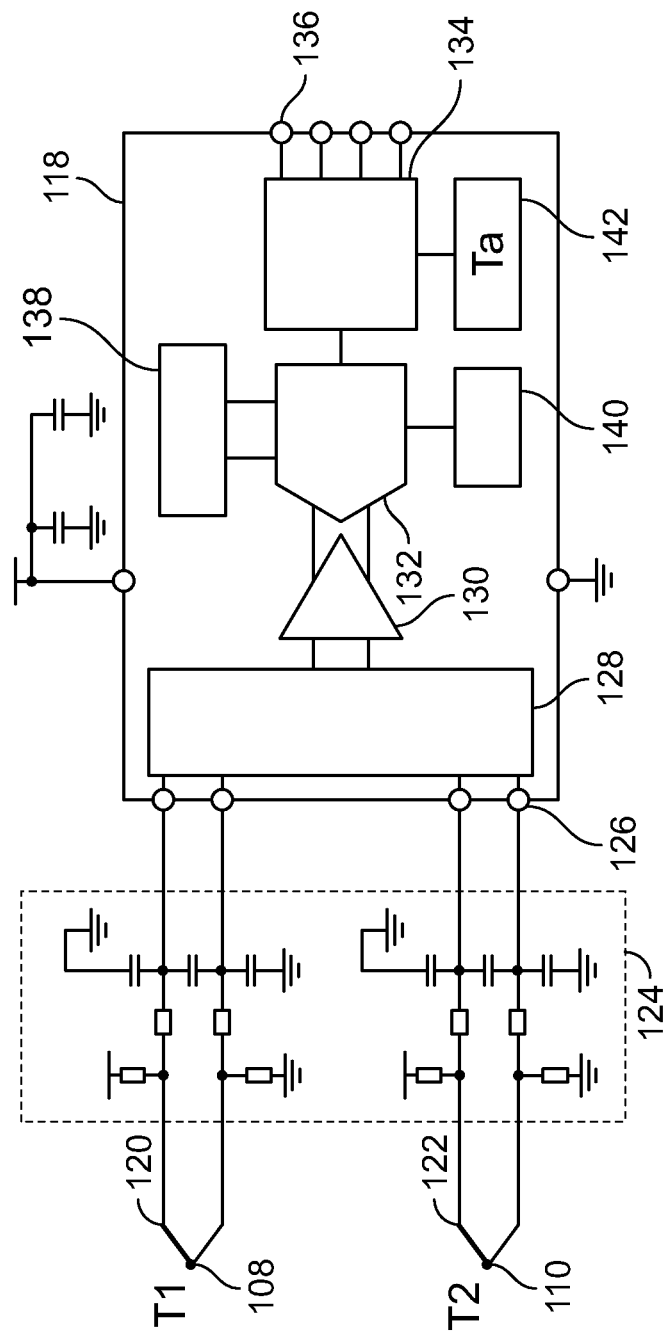
FIG. 2 is a circuit diagram of a measurement circuit for detecting the temperature at a first measurement region and a second measurement region of the contact pin.

An evaluation circuit 118 according to an embodiment is shown in FIG. 2. The evaluation circuit 118 may also be referred to as an electronic evaluation and control unit 118. The evaluation circuit 118 can be connected to a first and a second thermocouple 120, 122, in order to ascertain the heat flow sought. The two thermocouples are connected to analogous input terminals 126 of the evaluation circuit 118 via a filtering and stabilizing circuit 124, for example. An input multiplexer 128 makes it possible to measure either four individual or two differential signals. The respectively selected signals are fed to an amplifier 130. The amplified signal is applied to the input of an analogue/digital converter 132, e.g. a delta-sigma analogue/digital converter. A serial interface 134 produces the connection to the digital terminals 136. A voltage reference 138 and an oscillator 140 are likewise provided. Furthermore, the evaluation circuit 118 has an internal third temperature sensor 142, which measures the temperature of the evaluation circuit 118 and thus an ambient temperature Ta. In an embodiment, the evaluation circuit 118 can be formed, for example, by a delta-sigma analogue/digital converter of the ADS1118 type from the manufacturer Texas Instruments.

According to the present invention, with the aid of this temperature detection with the temperature sensor 142, on the one hand a cold junction compensation (CJC) can be carried out, and on the other hand a value for the ambient temperature Ta can be made available, which is required for the modelling of the pin 100.

The evaluation circuit 118 makes it possible to carry out the A/D conversion of the values for the temperatures T1, T2 and Ta on the high-voltage side, so that only digital signals from the high-voltage side have to be transmitted securely for low-voltage signal processing. Digital information can be transmitted substantially more cost-effectively than analogue signals in a galvanically separated way via optical or magnetic isolation. Moreover, a diagnosis unit (not shown in the figures) integrated in the evaluation circuit 118 makes it possible to make safety-relevant diagnosis data available such as, for example, the determination of a wire breakage or a short-circuit at the temperature probes and thus makes self-diagnosis of the plug connector possible.

If, in the case of a plug connector which is part of a charging cable, it is envisaged to use two evaluation circuits 118, namely an evaluation circuit for the DC+ pin and an evaluation circuit for the DC− pin respectively, an exceptionally high safety level (for example Automotive Safety Integrity Level C (ASIL C) according to ISO 26262-1:2011 "Road vehicles—Functional safety") can be achieved for the temperature monitoring.

Figure 3:
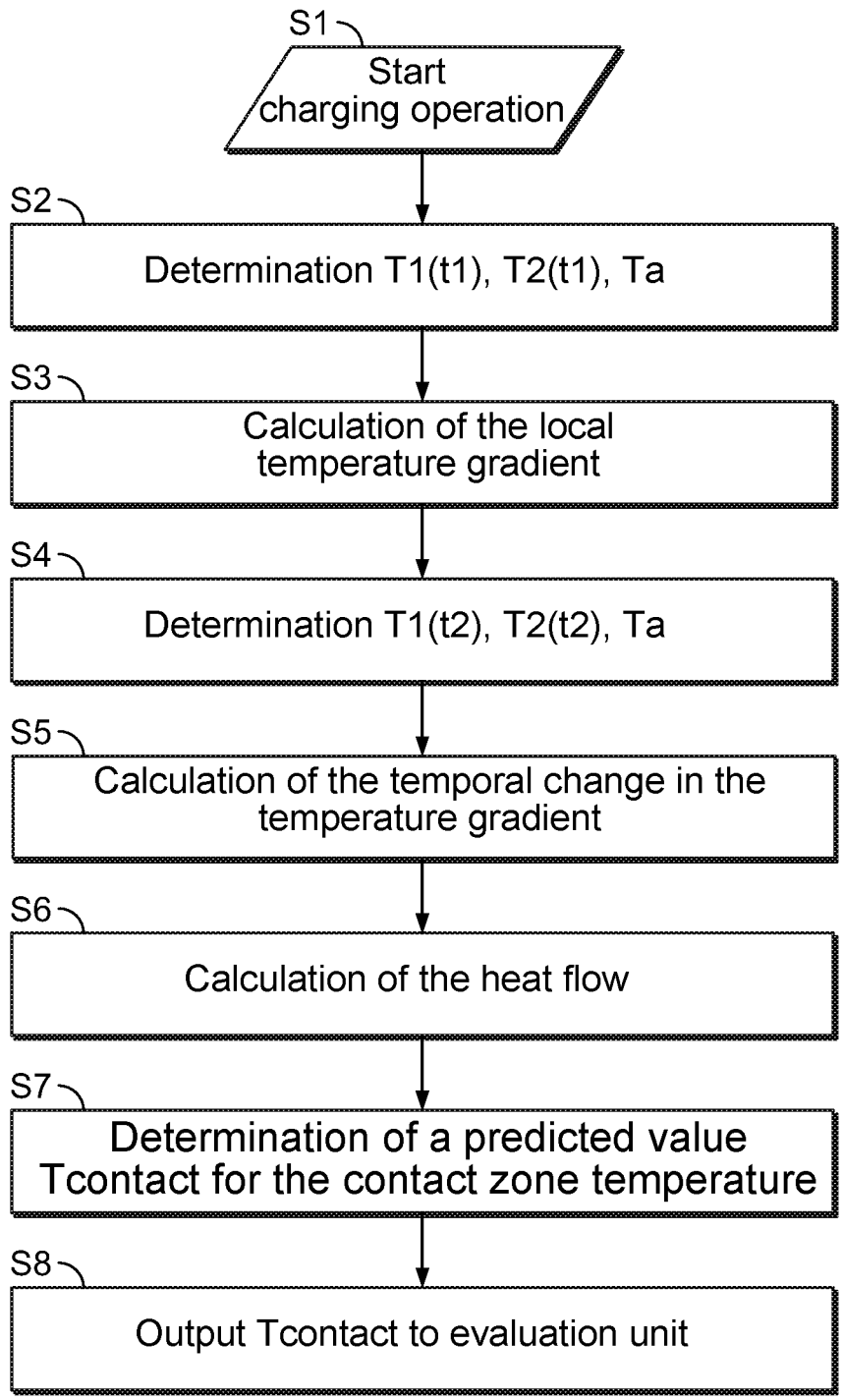
FIG. 3 is a flowchart of a method for monitoring a charging operation.

FIG. 3 illustrates, in the form of a flowchart, the individual steps which are carried out in the case of the temperature monitoring according to the invention, during a charging operation, for example of a battery of an electric vehicle. The method is for monitoring the temperature at a plug connector during an electrical current flow, which takes place through the plug connector.

After the charging operation has been started, a current flow is taking place (step S1). In the step S1, an electric current is applied to the contact element 100, wherein the contact element 100 is connected to an associated mating contact element. The temperatures T1, T2 and Ta are ascertained at a first time t1 (step S2), ascertaining first temperature values at a first measurement region 108 and at a second measurement region 110, spaced apart from the first measurement region 108, along the longitudinal axis 112 of the contact element 100.

A local temperature gradient can be calculated (step S3) from the amount and the sign of the difference between T1 and T2. Subsequently, the temperatures T1, T2 and Ta are ascertained (step S4) at a second time t2 and a second local temperature gradient is calculated from the second temperature values. The temporal change in the temperature gradient is ascertained (step S5) from the comparison of the two local temperature gradients. The heat flow through the contact pin 100 can be calculated (step S6) from this temporal change in the temperature gradient according to amount and sign. This determination of the heat flow $\dot{Q}$ corresponds to a calorimetry, in which the fed-in temperature difference is ascertained from the heat flow.

With the aid of the heat flow $\dot{Q}$ and the thermal resistances and thermal capacitances known from the equivalent circuit diagram 102, a predicted temperature value $T_{contact}$ can be calculated (step S7) for the temperature of the contact zone. For the calculation of the predicted or estimated value, the difference between the two first and the two second temperature values and also an absolute value for at least one each of the two first and the two second temperature values is used. The estimated value can be compared to a target value, for example, the electrical current flow being regulated in such a way that the estimated value does not exceed a predetermined deviation from the target value. Alternatively, a comparison of the estimated value with a threshold value can also be provided.

Such an estimated value can, for example, predict the temperature occurring at the contact region 104 between the contact element 100 and the mating contact element. Thus, by measuring the two temperature values in the first and second measurement regions 108, 110, it can be ensured that an imminent overheating in the contact region 104, for example, is prevented. According to the invention, a warning signal for example is generated for interrupting or reducing the current flow, when the estimated value exceeds the threshold value, and/or the extrapolated contact temperature is made available to the control appliance.

For example, a particularly simple excess temperature shut-down can be implemented, by using two threshold values. If, on the one hand, a first threshold value is set for the temperature difference and, on the other hand, a second threshold value is specified for the absolute temperature in the first measurement region, it is possible, by appropriate selection of the threshold values, to reach conclusions on the attainment of a certain critical temperature within a predetermined time from the attainment of the threshold values. For example, the contact element can be made such that, when a difference T1-T2 is greater than or equal to 14° C. and an absolute temperature of T1 is greater than or equal to 50° C., it can always be predicted that a contact temperature $T_{contact}$ of more than 90° C. prevails at the contact zone.

The predicted temperature value $T_{contact}$ is outputted to an evaluation unit in step S8 and can now be compared with a stored limit value $T_{grenz}$ for the temperature at the contact zone. If the predicted temperature value $T_{contact}$ has reached or exceeded the threshold value $T_{grenz}$, the charging operation can be aborted, for example, and/or further safety-relevant measures can be initiated. Provision can also be made for regulation of the charging current density to be carried out, which ensures that the calculated temperature in the contact zone remains around a desired target temperature within a predetermined tolerance band.

If no criteria for ending the charging operation are recognized as fulfilled, the monitoring method returns to step S2 and the method is run through again. Otherwise, the charging operation is ended. Criteria for ending the charging operation, besides the emergency shut-down signals generated by the temperature monitoring, are also criteria for a regular shut-down, for example when the battery is sufficiently charged.

Through the use of the method according to the invention, in particular in the case of ultra-rapid charging operations for electric vehicles, it can be ensured that the temperature in the contact region not accessible for direct measurement can be monitored sufficiently safely and accurately and, if required, can even be regulated.

Another embodiment includes the temporal change in the temperature and the ambient temperature. This is necessary in particular in the case of a temperature-controlled charging operation in mode 5. In an embodiment, the above steps are repeated until the estimated value exceeds the threshold value, or the connection between the contact element and the mating contact element is cut. In this way, monitoring can take place during the entire current transmission process.

In order to take into account the influence of the thermal losses to the environment, and to thereby make the calculation of the estimated value even more accurate, provision can be made, moreover, for the ambient temperature, remote from the at least one contact element 100, to be detected and to be entered into the calculation of the estimated value. The detection of the ambient temperature can take place, for example, by means of a temperature probe, which is an integral component of an electronic module, which contains the evaluation and control unit, or else can be made available by the vehicle via a data bus system.

The principles of the present invention can be used in further advantageous variations. By way of example, the contact element itself can form part of the thermocouple. For this purpose, the thermocouple copper/constantan (Cu/CuNi) type T is particularly suitable, because the contact elements are frequently produced from copper. For this configuration, it is necessary to provide sufficient electrical insulation between the high-voltage side and the evaluation electronics.

In an embodiment, the first temperature probe has the first thermocouple 120, which comprises a first conductor and a second conductor, the first and the second conductor being produced from different materials and being connected to each other at a first measurement point, and the second temperature probe has the second thermocouple 122, which comprises a third conductor and a fourth conductor, the third and the fourth conductor being produced from different materials and being connected to each other at a second measurement point. The first measurement point and the second measurement point are in abutment with the base body 105. In this way, a measuring arrangement which is reliable and robust can be implemented in a particularly simple and space-saving manner.

Thermocouples are based on the so-called thermoelectric effect: If two wires of different materials are connected, a voltage can be measured at their free ends if the connection point is at a different temperature than these free ends. The temperature difference is always measured between the temperature at the connection point and the temperature at the terminals (clamps) of a measuring appliance. The thermoelectric effect is based on a material-specific property of electrically conductive materials. In the interior of a conductor, the temperature effect causes a shift in the electron density (volume diffusion effect), when a temperature change (rise or fall) occurs via the conductor. In mathematical terms, this change is referred to as a temperature gradient. At the hot end, owing to the higher kinetic energy, an impoverishment occurs and at the cold end an enrichment of the charge carrier occurs. Each conductor piece is a voltage source for itself alone. The arrangement of two connected wires is called a thermocouple or thermopair. Only the difference in voltage sums in the wires of different materials produces a measurable voltage, which is a measure for the temperature difference between the connection point and the clamps of the measuring appliance.

Depending on the material combination, there arises a reproducible dependency of the thermoelectric voltage on the temperature at the connection point. From the multiplicity of possible wire pairings (over 300 material pairings for the temperature measurement are known), some are used for industrial temperature measurement. The thermoelectric voltages here lie in the range from 5 mV/° C. to approximately 100 mV/° C. The materials suitable for industrial temperature measurement are standardized in DIN EN 60584-1 (DIN EN 60584-1:2014-07, title (German): Thermoelemente—Teil 1: Thermospannungen and Grenzabweichungen [Thermocouples—part 1: thermoelectric voltages and limit deviations] (IEC 60584-1:2013); German version EN 60584-1:2013. The thermoelectric voltages specified in this standard always relate to a reference point temperature of 0° C.

The materials suitable for temperature measurement can be depicted mostly in relation to platinum as reference metal, ordered according to thermoelectric voltage in a thermoelectric voltage series, as is commonly known to a person skilled in the art. Examples of thermocouples are platinum/rhodium-platinum (Pt/RhPt) type S, type R, nickel-chromium/nickel (NiCr/Ni) type K or copper/constantan (Cu/CuNi) type T.

The present description of the embodiments is limited to the exemplary use of thermocouples as temperature probes. For a person skilled in the art, however, it is clear that every other type of temperature sensors can also be used as a temperature probe according to the present invention, for example resistance sensors such as Pt100 or Ni100 elements, and also resistance elements with negative or positive temperature coefficients (NTC or PTC elements).

In an embodiment, the first and the fourth conductor can be produced from the same material. In this way, the series connection of the two thermocouples can be wired firmly, so that a line can be saved at a common terminal of the two thermocouples. If a thermocouple is chosen, the one material of which matches the material of the contact element, the construction can be simplified even further, by forming at least one of the first to fourth conductors through the base body 105 of the contact element. The abovementioned thermopair copper/constantan (type T) is suitable in this context, if the contact element is produced from copper (at least in the measurement region 108, 110).

By way of example, two sensors are used which have opposing characteristic curves of their output signals as a function of the temperature. Such sensors can be connected in series, in order to ascertain a differential temperature. By way of example, two thermocouples 120, 122 of equal pairing can be used, which are connected to each other in a diametrically opposed manner in order to measure the total voltage. If this series circuit is wired firmly, a line can be saved at the common terminal of the two thermocouples 120, 122. However, it must be ensured that, moreover, a measurement value for the absolute temperature is also ascertained at one of the two temperature probes.

In the illustration in FIG. 1, the material of the base body 105 can be included in the temperature measurement, by it being part of the first and/or second thermopair. By way of example, the base body 105 of the contact pin 100 can be composed (at least partly) of copper at least in the measurement regions 108, 110, such that a first constantan (CuNi) wire placed in the first measurement region 108 forms a first thermocouple with the base body 105 and a second constantan wire placed in the second measurement region 110 forms a second thermocouple. The voltage which can be tapped off between the first and the second constantan wire forms the temperature difference between the first and the second measurement regions 108, 110.

The plug connector according to the present invention comprises, in an embodiment, a housing and a contact locking apparatus, which fixes the contact pin 100 to the housing. The contact locking apparatus engages into a circumferential groove between the two measurement regions 108, 110.

In another embodiment, provision can also be made for the electronic evaluation and control unit to be part of an "In-Cable Control- and Protecting Device" (IC-CPD) or a part of the vehicle electronics. Moreover, provision can also be made for both the plug connector and the mating plug connector to be equipped with temperature probes according to the present invention and also for the charging station to have a corresponding evaluation and control unit.

What is claimed is:

1. An electrical contact element, comprising:
   an electrically conductive base body having a longitudinal axis extending along a plugging direction; and
   a first temperature probe and a second temperature probe arranged at a pair of different measurement regions of the electrical contact element spaced apart from each other along the longitudinal axis, the first temperature probe and the second temperature probe measuring an absolute temperature of the electrical contact element at the pair of different measurement regions, the electrically conductive base body has a smaller thermally conductive cross-sectional area between the measurement regions than in other regions of the electrical contact element.

2. The electrical contact element of claim 1, wherein the electrical contact element is a contact pin.

3. The electrical contact element of claim 1, wherein at least one of the first temperature probe and the second temperature probe has a thermocouple.

4. The electrical contact element of claim 1, further comprising an evaluation circuit connected to the first temperature probe and the second temperature probe, the evaluation circuit calculates an estimated value for a temperature in a monitoring region of the electrical contact element different from the measurement regions.

5. The electrical contact element of claim 1, further comprising a housing and a contact locking apparatus fixing the electrical contact element to the housing.

6. The electrical contact element of claim 5, wherein the electrically conductive base body has a circumferential groove between the measurement regions, the contact locking apparatus engages with the circumferential groove.

7. A method for monitoring a temperature during an electrical current flow, comprising:
   providing a contact element including an electrically conductive base body having a longitudinal axis extending along a plugging direction;
   applying an electric current to the contact element;
   at a first time, ascertaining a plurality of first temperature values at a first measurement region and a second measurement region of the contact element spaced apart from each other along the longitudinal axis, the first temperature values are an absolute temperature at the first measurement region and the second measurement region, the electrically conductive base body has a smaller thermally conductive cross-sectional area between the measurement regions than in other regions of the contact element;
   calculating a first local temperature gradient from the first temperature values;
   at a second time, ascertaining a plurality of second temperature values at the first measurement region and the second measurement region;
   calculating a second local temperature gradient from the second temperature values;
   calculating a temporal change in the local temperature gradient;
   calculating an estimated value for a temperature in a monitoring region of the contact element different from the measurement regions based on the temporal change in the local temperature gradient; and
   outputting the estimated value to an evaluation unit.

8. The method of claim 7, wherein the estimated value is compared to a target value and the electrical current flow is regulated in such a way that the estimated value does not exceed a predetermined deviation from the target value.

9. The method of claim 7, wherein the estimated value is compared to a threshold value and the electrical current flow is interrupted when the threshold value is exceeded.

10. The method of claim 9, wherein a warning signal for interrupting or reducing the electrical current flow is generated when the estimated value exceeds the threshold value.

11. The method of claim 9, wherein the applying, ascertaining, calculating, outputting, and comparing steps are repeated until the estimated value exceeds the threshold value or a connection at the contact element is cut.

12. The method of claim 7, further comprising detecting an ambient temperature remote from the contact element, the ambient temperature is entered into the calculation of the estimated value.

* * * * *